(12) United States Patent  (10) Patent No.: US 7,936,064 B2
Yuzawa et al. (45) Date of Patent: May 3, 2011

(54) SEMICONDUCTOR DEVICE

(75) Inventors: Takeshi Yuzawa, Chino (JP); Masatoshi Tagaki, Suwa (JP)

(73) Assignee: Seiko Epson Corporation (JP)

( * ) Notice: Subject to any disclaimer, the term of this patent is extended or adjusted under 35 U.S.C. 154(b) by 605 days.

(21) Appl. No.: 11/444,275

(22) Filed: May 31, 2006

(65) Prior Publication Data
US 2007/0018317 A1 Jan. 25, 2007

(30) Foreign Application Priority Data

Jul. 19, 2005 (JP) ................................. 2005-208666

(51) Int. Cl.
H01L 29/15 (2006.01)
(52) U.S. Cl. ........ 257/734; 257/737; 257/756; 257/758; 257/E23.151
(58) Field of Classification Search .................. 257/734, 257/737, 756, 758, E23.151
See application file for complete search history.

(56) References Cited

U.S. PATENT DOCUMENTS

| | | | |
|---|---|---|---|
| 5,084,752 A | 1/1992 | Satoh et al. | |
| 6,130,485 A | 10/2000 | Hirai | |
| 6,268,642 B1 | 7/2001 | Hsuan et al. | |
| 6,441,467 B2 | 8/2002 | Toyosawa et al. | |
| 6,465,895 B1 | 10/2002 | Park et al. | |
| 6,538,326 B2 | 3/2003 | Shimizu et al. | |
| 6,650,002 B1 | 11/2003 | Toyosawa et al. | |
| 6,781,238 B2 | 8/2004 | Nonaka | |
| 6,864,562 B1 | 3/2005 | Toyosawa et al. | |
| 7,312,530 B2 | 12/2007 | Hashimoto et al. | |
| 2004/0132236 A1* | 7/2004 | Doris et al. | 438/182 |
| 2005/0285116 A1* | 12/2005 | Wang | 257/76 |
| 2007/0007599 A1 | 1/2007 | Shindo et al. | |
| 2007/0007662 A1 | 1/2007 | Shindo et al. | |
| 2008/0284026 A1 | 11/2008 | Hashimoto et al. | |

FOREIGN PATENT DOCUMENTS

| | | |
|---|---|---|
| CN | 1601735 | 9/2004 |
| JP | 02-024540 | 2/1990 |
| JP | 3-73438 | 7/1991 |
| JP | 03-073438 | 7/1991 |
| JP | 2535529 | 2/1997 |
| JP | 11-126790 | 5/1999 |
| JP | 11-145199 | 5/1999 |
| JP | 2000-058549 | 2/2000 |
| JP | 2001-110833 | 4/2001 |
| JP | 2001-284537 | 10/2001 |
| JP | 2002-319587 | 10/2002 |
| JP | 2003-179063 | 6/2003 |
| JP | 2003-297865 | 10/2003 |

(Continued)

*Primary Examiner* — Cuong Q Nguyen
*Assistant Examiner* — Trang Q Tran
(74) *Attorney, Agent, or Firm* — Harness, Dickey & Pierce, P.L.C.

(57) ABSTRACT

A semiconductor device, including: a semiconductor layer having an active region; a first conductive layer formed above the semiconductor layer and having a first width; a second conductive layer connected to the first conductive layer and having a second width smaller than the first width; an interlayer dielectric formed above the semiconductor layer; an electrode pad formed above the interlayer dielectric and covering the active region when viewed from a top side; and a forbidden region provided in the semiconductor layer in a specific range positioned outward from a line extending vertically downward from an edge of at least part of the electrode pad. A connection section at which the first conductive layer and the second conductive layer are connected is not provided in the forbidden region.

9 Claims, 6 Drawing Sheets

FOREIGN PATENT DOCUMENTS

| | | |
|---|---|---|
| JP | 2003-347333 | 12/2003 |
| JP | 2004-207509 | 7/2004 |
| JP | 3608393 | 10/2004 |
| JP | 2004-363173 | 12/2004 |
| JP | 2004-363224 | 12/2004 |
| JP | 2005-050963 | 2/2005 |
| JP | 2005-108954 | 4/2005 |
| KR | 1997-0077390 | 12/1997 |
| KR | 1999-0052264 | 7/1999 |
| KR | 1999-0070614 | 9/1999 |
| KR | 10-0302536 | 7/2001 |
| KR | 2001-0061082 | 7/2001 |
| KR | 2002-0030258 | 4/2002 |
| KR | 10-0419813 | 2/2004 |
| KR | 2007-0005498 | 1/2007 |
| KR | 2007-0005521 | 1/2007 |

* cited by examiner

SEMICONDUCTOR DEVICE

Japanese Patent Application No. 2005-208666, filed on Jul. 19, 2005, is hereby incorporated by reference in its entirety.

BACKGROUND OF THE INVENTION

The present invention relates to a semiconductor device.

In related-art technology, when a semiconductor element such as a MIS transistor is disposed under a pad, the characteristics of the semiconductor element such as a MIS transistor may be impaired due to stress during bonding. Therefore, the pad formation region and the semiconductor element formation region are separately provided in a semiconductor chip when viewed from the top side. However, since the semiconductor chip has been scaled down and increased in degree of integration, disposition of the semiconductor element under the pad has been demanded. JP-A-2002-319587 discloses such technology, for example.

SUMMARY

According to a first aspect of the invention, there is provided a semiconductor device, comprising:
a semiconductor layer having an active region;
a first conductive layer formed above the semiconductor layer and having a first width;
a second conductive layer connected to the first conductive layer and having a second width smaller than the first width;
an interlayer dielectric formed above the semiconductor layer;
an electrode pad formed above the interlayer dielectric and covering the active region when viewed from a top side; and
a forbidden region provided in the semiconductor layer in a specific range positioned outward from a line extending vertically downward from an edge of at least part of the electrode pad,
a connection section at which the first conductive layer and the second conductive layer are connected being not provided in the forbidden region.

According to a second aspect of the invention, there is provided a semiconductor device, comprising:
a semiconductor layer having an active region;
an interlayer dielectric formed above the semiconductor layer;
an electrode pad formed above the interlayer dielectric;
a passivation layer formed above the electrode pad and having an opening which exposes at least part of the electrode pad;
a bump formed in the opening and covering the active region when viewed from a top side; and
a forbidden region provided in the semiconductor layer in a specific range positioned inward and outward from a line extending vertically downward from an edge of at least part of the bump,
a connection section at which the first conductive layer and the second conductive layer are connected being not provided in the forbidden region.

DETAILED DESCRIPTION OF THE EMBODIMENT

Figure 1:
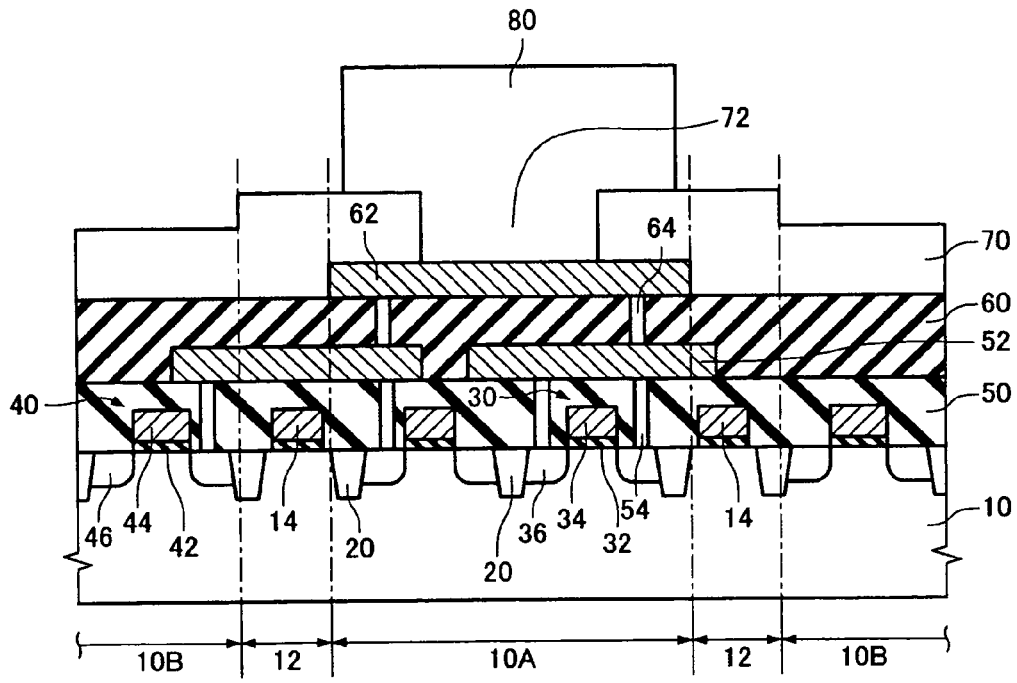
FIG. 1 is a view illustrative of a semiconductor device according to a first embodiment.

The invention may provide a highly reliable semiconductor device in which a semiconductor element can be formed under an electrode pad.

(1) According to one embodiment of the invention, there is provided a semiconductor device, comprising:
a semiconductor layer having an active region;
a first conductive layer formed above the semiconductor layer and having a first width;
a second conductive layer connected to the first conductive layer and having a second width smaller than the first width;
an interlayer dielectric formed above the semiconductor layer;
an electrode pad formed above the interlayer dielectric and covering the active region when viewed from a top side; and
a forbidden region provided in the semiconductor layer in a specific range positioned outward from a line extending vertically downward from an edge of at least part of the electrode pad,
a connection section at which the first conductive layer and the second conductive layer are connected being not provided in the forbidden region.

In the semiconductor device according to this embodiment, stress tends to occur after formation of the electrode pad in a specific range positioned outward from a line extending vertically downward from the edge of at least part of the electrode pad. Therefore, cracks tend to occur in the interlayer dielectric disposed in this specific area. For example, when a semiconductor element such as a MIS transistor is formed in the semiconductor layer in this specific area, the characteristics of the MIS transistor may deteriorate. In the semiconductor device according to this embodiment, the above problem is eliminated by providing the forbidden region in this specific region. Moreover, this embodiment can provide a semiconductor device which is scaled down due to an increase in the degree of integration of elements and provided with improved reliability by disposing an element under the electrode pad at a position in which the element can be formed without causing a problem. According to this embodiment, since the connection section in which the first conductive layer and the second conductive layer are connected is not disposed in the forbidden region, cracks do not occur in the conductive layer.

In this embodiment, the active region means a region in which various elements such as a MIS transistor, diode, and resistor are formed. In this embodiment, the statement "a specific layer B (hereinafter called "layer B") formed above a specific layer A (hereinafter called "layer A")" includes the case where the layer B is directly formed on the layer A and the case where the layer B is formed on the layer A through another layer.

The semiconductor device according to this embodiment may have the following features.

(2) In this semiconductor device,
the electrode pad may have a rectangular shape having a short side and a long side; and
the forbidden region may be a specific region positioned outward from a line extending vertically downward from the short side of the electrode pad.

(3) In this semiconductor device, the forbidden region may be provided to enclose an element.

(4) In this semiconductor device, the forbidden region may be a range having a width of 1.0 to 2.5 micrometers outward from a line extending vertically downward from the edge of the electrode pad.

(5) The semiconductor device may comprise:
a passivation layer formed above the electrode pad and having an opening which exposes at least part of the electrode pad,
wherein the forbidden region is a region having a width corresponding to a thickness of the passivation layer outward from a line extending vertically downward from the edge of the electrode pad.

(6) The semiconductor device may comprise a bump formed in the opening.

(7) According to one embodiment of the invention, there is provided a semiconductor device, comprising:
a semiconductor layer having an active region;
an interlayer dielectric formed above the semiconductor layer;
an electrode pad formed above the interlayer dielectric;
a passivation layer formed above the electrode pad and having an opening which exposes at least part of the electrode pad;
a bump formed in the opening and covering the active region when viewed from a top side; and
a forbidden region provided in the semiconductor layer in a specific range positioned inward and outward from a line extending vertically downward from an edge of at least part of the bump,
a connection section at which the first conductive layer and the second conductive layer are connected being not provided in the forbidden region.

In the semiconductor device according to this embodiment, stress tends to occur in a specific range positioned inward and outward from a line extending vertically downward from the edge of at least part of the bump after forming the bump on the electrode pad. Therefore, cracks tend to occur in the interlayer dielectric disposed in this specific area. For example, when a semiconductor element such as a MIS transistor is formed in the semiconductor layer in this specific area, the characteristics of the MIS transistor may deteriorate. In the semiconductor device according to this embodiment, the above problem is eliminated by providing the forbidden region in this specific region. Moreover, this embodiment can provide a semiconductor device which is scaled down due to an increase in the degree of integration of elements and provided with improved reliability by disposing an element under the electrode pad at a position in which the element can be formed without causing a problem. According to this embodiment, since the connection section in which the first conductive layer and the second conductive layer are connected is not disposed in the forbidden region, cracks do not occur in the conductive layer.

(8) In this semiconductor device,
the bump may have a rectangular shape having a short side and a long side; and
the forbidden region may be a specific region positioned inward and outward from a line extending vertically downward from the short side of the bump.

(9) In this semiconductor device, the forbidden region may be provided to enclose an element.

(10) In this semiconductor device, the forbidden region may be a region having a width of 2.0 to 3.0 micrometers outward from a line extending vertically downward from the edge of the bump and having a width of 2.0 to 3.0 micrometers inward from a line extending vertically downward from the edge of the bump.

(11) In this semiconductor device, a transistor may be formed in the active region.

(12) In this semiconductor device, the forbidden region may be a forbidden region for a low-voltage-drive transistor.

(13) In this semiconductor device, a high-voltage transistor may be formed in the forbidden region.

(14) In this semiconductor device, the first conductive layer and the second conductive layer may be connected in a shape of the letter "T" or "L".

(15) In this semiconductor device, the first conductive layer and the second conductive layer may be polysilicon layers.

1. First Embodiment

Figure 2:
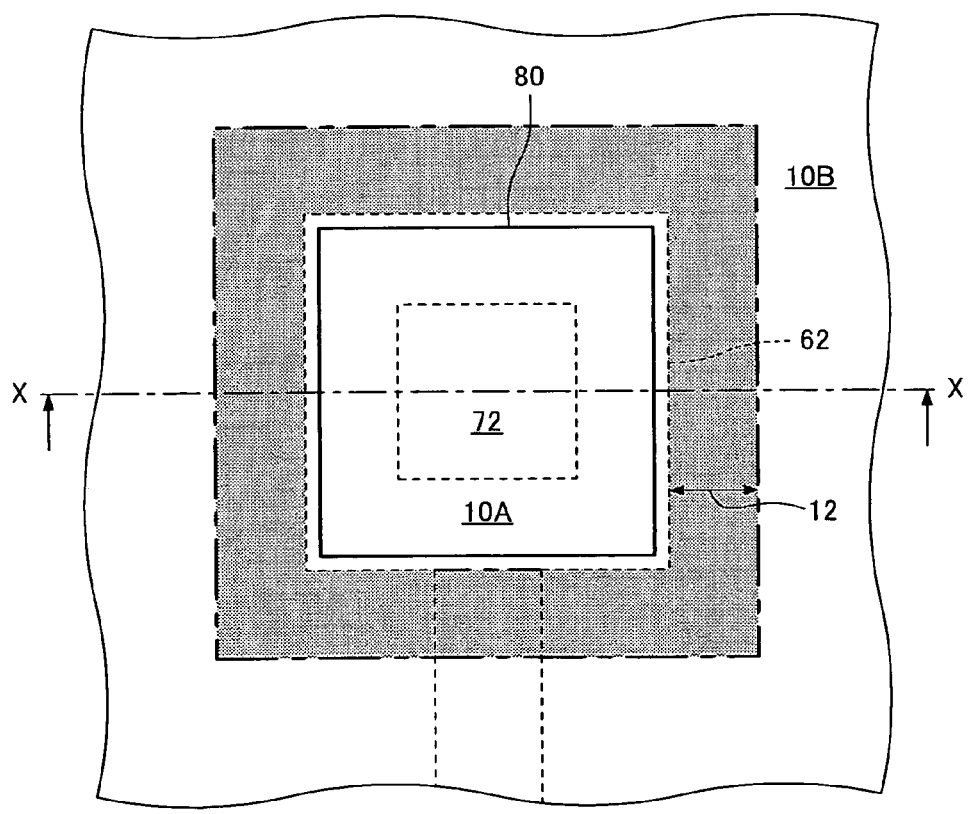
FIG. 2 is a view illustrative of a semiconductor device according to the first embodiment.

FIG. 1 is a cross-sectional view schematically showing a semiconductor device according to a first embodiment of the invention, and FIG. 2 is a plan view schematically showing the relationship between the shape of an electrode pad and a forbidden region in the semiconductor device according to the first embodiment. FIG. 1 shows the cross section along the line X-X shown in FIG. 2.

As shown in FIG. 1, the semiconductor device according to the first embodiment includes a semiconductor layer 10. As the semiconductor layer 10, a single crystal silicon substrate, a silicon on insulator (SOI) substrate in which a semiconductor layer is formed on an insulating layer, the semiconductor layer being a silicon layer, a germanium layer, or a silicon germanium layer, or the like may be used.

An isolation insulating layer 20 is formed in the semiconductor layer 10. The isolation insulating layer 20 may be formed by a shallow trench isolation (STI) method, a local oxidation of silicon (LOCOS) method, or a semi-recessed LOCOS method. FIG. 1 shows the isolation insulating layer 20 formed by the STI method. The active region 10A is a region provided under an electrode pad, as described later. The forbidden region 12 is the gray area shown in FIG. 2, which is the semiconductor layer 10 in a specific range outward from a line extending vertically downward from the edge of the electrode pad. The forbidden region 12 is also described later. In the semiconductor device according to the first embodiment, an active region 10B is provided outside the forbidden region 12.

A low-voltage-drive metal insulator semiconductor (MIS) transistor 30 is formed in the active region 10A. An MIS transistor 40 is formed in the active region 10B in the same manner as in the active region 10A. The MIS transistor 30 includes a gate insulating layer 32, a gate electrode 34 formed on the gate insulating layer 32, and impurity regions 36 formed in the semiconductor layer 10. The impurity region 36 serves as a source region or a drain region. The MIS transistor 40 is a low-voltage-drive transistor which has a structure similar to that of the MIS transistor 30 and includes a gate insulating layer 42, a gate electrode 44, and impurity regions 46 and in which an insulating layer is not formed in an offset region.

An interlayer dielectric 50 provided to cover the MIS transistors 30 and 40 and an interlayer dielectric 60 are formed on the MIS transistors 30 and 40 in that order. The interlayer dielectric 50 and the interlayer dielectric 60 may be formed using a known material. An interconnect layer 52 having a specific pattern is formed on the interlayer dielectric 50. The interconnect layer 52 and the impurity region 36 of the MIS transistor 30 are electrically connected through a contact layer 54.

An electrode pad 62 is formed on the interlayer dielectric 60. The electrode pad 62 may be electrically connected with the interconnect layer 52 through a contact layer 64. The electrode pad 62 may be formed of a metal such as aluminum or copper.

As shown in FIG. 1, the semiconductor device according to the first embodiment further includes a passivation layer 70. An opening 72 which exposes at least part of the electrode pad 62 is formed in the passivation layer 70. As shown in FIGS. 1 and 2, the opening 72 may be formed to expose only the center region of the electrode pad 62. Specifically, the passivation layer 70 may be formed to cover the edge portion of the electrode pad 62. The passivation layer may be formed of $SiO_2$, SiN, a polyimide resin, or the like. In the semiconductor device according to the first embodiment, the term "electrode pad" refers to a region which includes the region in which the opening 72 is formed and has a width greater than that of the interconnect section.

In the semiconductor device according to the first embodiment, a bump 80 is formed at least in the opening 72. Specifically, the bump 80 is formed on the exposed surface of the electrode pad 62. In the semiconductor device according to the first embodiment shown in FIG. 1, the bump 80 is also formed on the passivation layer 70. The bump 80 may include one or more layers and may be formed of a metal such as gold, nickel, or copper. The external shape of the bump 80 is not particularly limited. The external shape of the bump 80 may be a quadrilateral (including square and rectangle) or a circle. The external shape of the bump 80 may cover less area than that of the electrode pad 62. In this case, the bump 80 may be formed only in the area in which the bump 80 overlaps the electrode pad 62.

A barrier layer (not shown) may be formed in the lowermost layer of the bump 80. The barrier layer prevents diffusion between the electrode pad 62 and the bump 80. The barrier layer may include one or more layers. The barrier layer may be formed by sputtering. The barrier layer may have a function of increasing the adhesion between the electrode pad 62 and the bump 80. The barrier layer may include a titanium tungsten (TiW) layer. When the barrier layer includes two or more layers, the outermost surface of the barrier layer may be an electroplating feed metal layer (e.g. Au layer) for depositing the bump 80.

The forbidden region 12 is described below. As described above, the forbidden region 12 refers to the region of the semiconductor layer 10 positioned within a specific range outward from a line extending vertically downward from the edge of the electrode pad 62.

Figure 8A:
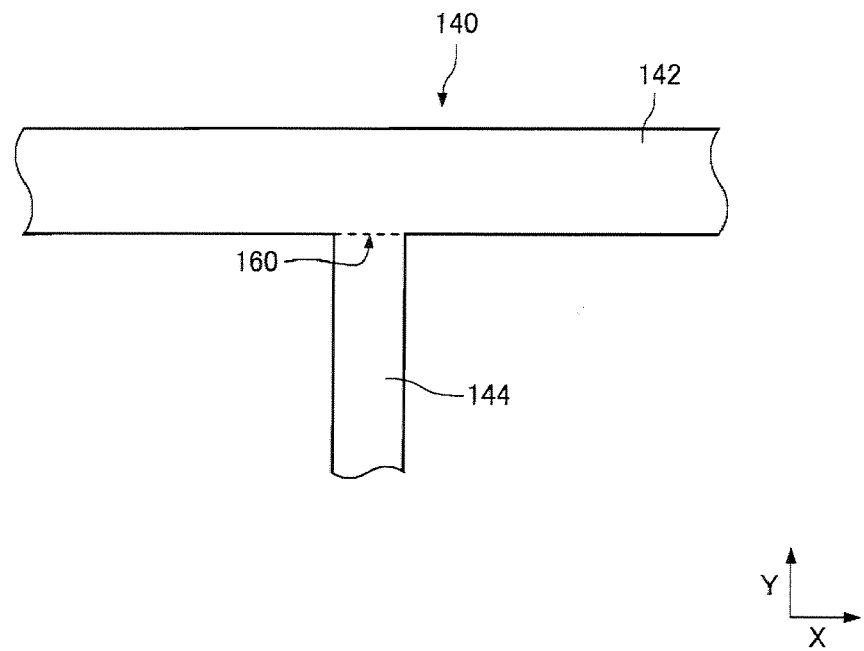
FIGS. 8A and 8B are views showing examples of a conductive layer which is not formed in a forbidden region.

In the forbidden region 12, a conductive layer 14 may be disposed on the semiconductor layer 10 as the first conductive layer. Note that a conductive layer in the shape of the letter "T" or "L" is not disposed as the first conductive layer in the forbidden region 12. As an example of the conductive layer which cannot be disposed in the forbidden region 12, a T-shaped conductive layer 140 shown in FIG. 8A which includes a first conductive layer 142 extending in a direction X and a second conductive layer 144 which branches in a direction Y from the first conductive layer 142 can be given.

Figure 8B:
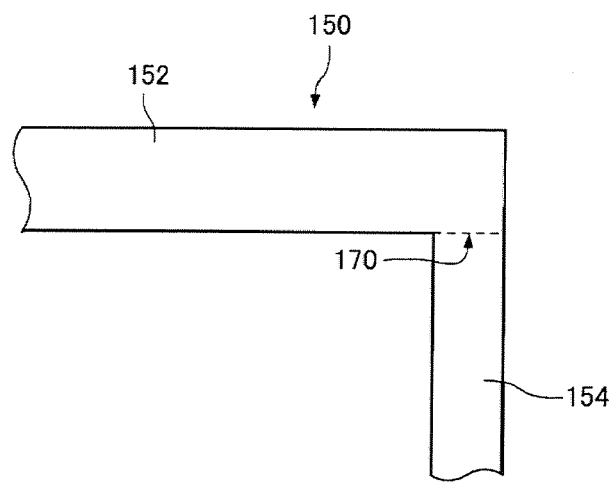

In particular, when the conductive layer 140 includes the first conductive layer 142 having a first width and the second conductive layer 144 connected with the first conductive layer 142 and having a second width smaller than the first width, defects such as cracks tend to occur near a boundary 160 (hereinafter may be called "connection section") between the first conductive layer 142 and the second conductive layer 144. As another example of the conductive layer which cannot be disposed in the forbidden region 12, an L-shaped conductive layer 150 shown in FIG. 8B which includes a first conductive layer 152 extending in the direction X and a second conductive layer 154 extending in the direction Y from the end of the first conductive layer 152 can be given. In particular, when the conductive layer 150 includes the first conductive layer 152 having a first width and the second conductive layer 154 connected with the first conductive layer 152 and having a second width smaller than the first width, defects such as cracks tend to occur near a boundary 170 (hereinafter may be called "connection section") between the first conductive layer 152 and the second conductive layer 154.

As examples of the conductive layer 14 which can be disposed in the forbidden region 12, an interconnect layer connected with the gate electrodes 34 and 44 and the like can be given. The conductive layer 14 may be formed in the same step as the gate electrodes 34 and 44. The conductive layer 14 may include a polysilicon layer. The polysilicon layer may be part of the conductive layer 14. Since the polysilicon layer tends to produce cracks due to stress in comparison with a metal layer, the conductive layer 14 with no defects can be formed by limiting the shape of the conductive layer 14 as in the first embodiment.

The forbidden region 12 may be the range having a width corresponding to the thickness of the passivation layer 70 outward (in the direction away from the opening 72) from a line extending vertically downward from the edge of the electrode pad 62. For example, the forbidden region 12 may be the range having a width of 1.0 to 2.5 micrometers outward from the edge of the electrode pad 62. The range of the forbidden region 12 is specified as described above for the following reasons.

When the electrode pad 62 is formed, stress occurs in the interlayer dielectric 60 at a position in which the edge of the electrode pad 62 is positioned. When the bump 80 is formed on the electrode pad 62, as shown in FIG. 1, a continuous stress additionally occurs due to the internal stress of the bump 80. The stress may cause cracks to occur in the interlayer dielectrics 50 and 60 from the position (edge of the electrode pad 62) at which the stress occurs. Such cracks may reach the lowermost interlayer dielectric, whereby the characteristics of the semiconductor element formed in such a region may be changed. For example, when a MIS transistor is formed in such a region, a gate insulating layer deteriorates, whereby a leakage current may be increased.

The passivation layer 70 is not formed on a surface having a uniform height. That is, the passivation layer 70 may have a surface having a level difference corresponding to the shape of the electrode pad 62. For example, when mounting the semiconductor device by a chip-on-film (COF) method, stress due to contact and bonding tends to be concentrated in the region in which the level difference is formed when connecting the bump 80 through a connection line (lead wire) formed on a film. This may also cause cracks to occur in the interlayer dielectrics 50 and 60. The level difference is generally formed in the area having a width approximately corresponding to the thickness of the passivation layer 70 outward from the edge of the electrode pad 62. The range of the forbidden region 12 may be specified taking these problems into consideration.

In the semiconductor device according to the first embodiment, the semiconductor layer positioned under the electrode pad 62 is the active region 10A, and the forbidden region 12 is provided in a specific region outward from a line extending vertically downward from the edge of the electrode pad 62. Stress tends to occur in a specific region outward from the edge of the electrode pad 62. Therefore, cracks tend to occur in the interlayer dielectrics 50 and 60 disposed above the forbidden region 12. For example, when a semiconductor element such as a MIS transistor is formed in the forbidden region 12, the characteristics of the MIS transistor may deteriorate. In the semiconductor device according to the first embodiment, the above-described problem is eliminated by providing the forbidden region 12 in the above specific range. The semiconductor layer 10 positioned inward from a line extending vertically downward from the edge of the electrode pad 62 can be provided as the active region 10A, whereby the semiconductor element can be disposed under the electrode pad 62. Specifically, the first embodiment can provide a semiconductor device which maintains reliability and can be scaled down due to an increase in the degree of integration by disposing the semiconductor element under the electrode pad 62 at a position in which the reliability is not affected without disposing the semiconductor element in the forbidden region 12.

Moreover, the semiconductor device according to the first embodiment allows the reliability of the conductive layer 14 to be increased by not forming a conductive layer in the shape of the letter "T" or "L" as the first conductive layer in the forbidden region 12. The range of the forbidden region 12 is not limited to the first layer, but may be applied to a conductive layer formed in the second or higher layer, for example.

2. Second Embodiment

A second embodiment of the invention is described below with reference to FIGS. 3 and 4.

Figure 3:
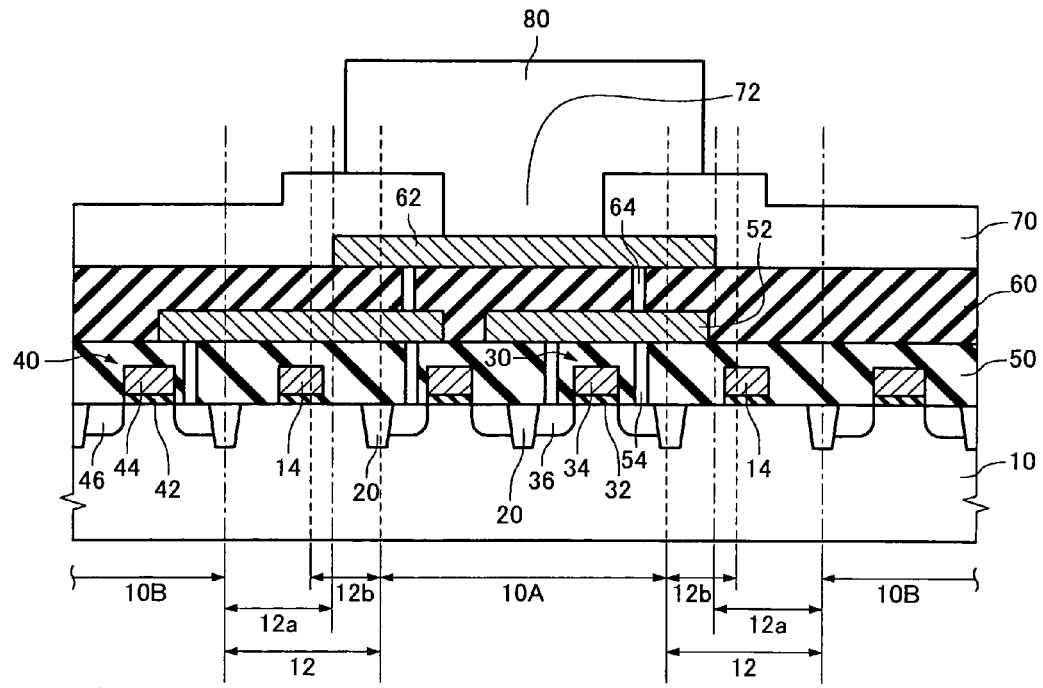
FIG. 3 is a view illustrative of a semiconductor device according to a second embodiment.
Figure 4:
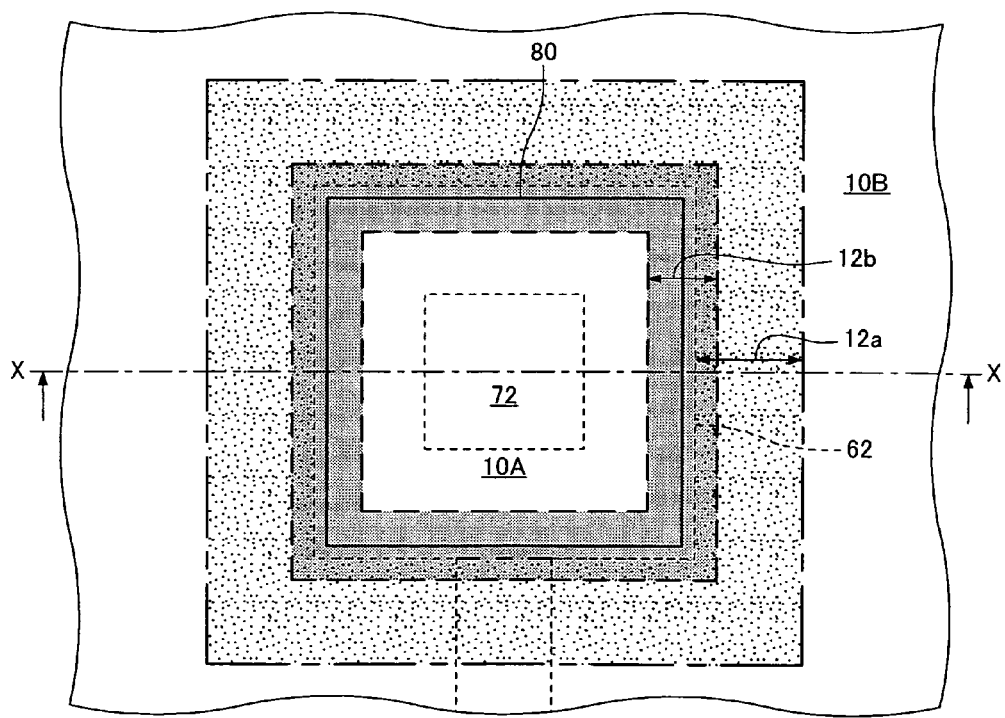
FIG. 4 is a view illustrative of a semiconductor device according to the second embodiment.

FIG. 3 is a cross-sectional view schematically showing a semiconductor device according to the second embodiment, and FIG. 4 is a plan view schematically showing the relationship between an electrode pad and a forbidden region in the semiconductor device according to the second embodiment. FIG. 3 shows the cross section along the line X-X shown in FIG. 4. Note that members substantially the same as the members in the first embodiment are assigned the same symbols. Detailed description of these members is omitted.

The semiconductor device according to the second embodiment differs from the semiconductor device according to the first embodiment in that the forbidden region 12 is specified taking into consideration the bump 80 in addition to the electrode pad 62 described in the first embodiment. In the second embodiment, the forbidden region 12 includes a first forbidden region 12a specified taking the electrode pad 62 into consideration and a second forbidden region 12b specified taking the bump 80 into consideration. A MIS transistor having a structure represented by the MIS transistors 30 and 40 is not disposed in the forbidden region 12, as described in the first embodiment.

The first forbidden region 12a has a range similar to that described in the first embodiment. Specifically, the first forbidden region 12a may be the range having a width corresponding to the thickness of the passivation layer 70 outward (in the direction away from the opening 72) from a line extending vertically downward from the edge of the electrode pad 62. For example, the first forbidden region 12a may be the range having a width of 1.0 to 2.5 micrometers outward from the edge of the electrode pad 62. The range of the forbidden region 12 is specified in this manner for the same reasons as described above.

The second forbidden region 12b may be the range having a width of 2.0 to 3.0 micrometers outward (in the direction away from the opening 72) from a line extending vertically downward from the edge of the bump 80 and having a width of 2.0 to 3.0 micrometers inward (in the direction toward the opening 72) from a line extending vertically downward from the edge of the bump 80. The range of the second forbidden region 12b is specified as described above for the following reasons.

Stress occurs near the edge of the bump 80 during the formation process of the bump 80. After the bump 80 has been formed, stress continuously occurs near the edge of the bump 80 due to the internal stress of the bump 80. The stress may cause cracks to occur in the interlayer dielectrics 50 and 60 from the position at which the stress occurs. Such cracks may reach the lowermost interlayer dielectric, whereby the characteristics of the semiconductor element formed in such a region may be changed. For example, when a MIS transistor is formed in such a region, a gate insulating layer deteriorates, whereby a leakage current may be increased.

The conductive layer 14 may be disposed on the semiconductor layer 10 as the first conductive layer in the forbidden region 12. Note that a conductive layer in the shape of the letter "T" or "L" is not disposed as the first conductive layer in the forbidden region 12. The types of conductive layer which cannot be disposed in the forbidden region 12 are the same as those described in the first embodiment.

As examples of the conductive layer 14 which can be disposed in the forbidden region 12, an interconnect layer connected with the gate electrodes 34 and 44 and the like can be given. The conductive layer 14 may be formed in the same step as the gate electrodes 34 and 44. The conductive layer 14 may include a polysilicon layer. The polysilicon layer tends to produce cracks due to stress in comparison with a metal layer.

In the semiconductor device according to the second embodiment, the semiconductor element can be formed under the electrode pad 62 and the bump 80 without causing the characteristics of the semiconductor element to deteriorate due to stress by providing the first forbidden region 12a specified taking the electrode pad 62 into consideration as described in the first embodiment and the second forbidden region 12b specified taking the bump 80 into consideration as the forbidden region 12. As a result, the degree of integration of semiconductor elements can be increased, whereby a semiconductor device which can be scaled down and maintains reliability can be provided. Moreover, the semiconductor device according to the second embodiment allows the reliability of the conductive layer 14 formed in the forbidden region 12 to be increased by not forming a conductive layer in the shape of the letter "T" or "L" as the first conductive layer in the forbidden region 12. The ranges of the forbidden regions 12a and 12b are not limited to the first layer, but may be applied to a conductive layer formed in the second or higher layer, for example.

In the second embodiment, it is preferable that the forbidden region 12 include the first forbidden region 12a specified taking the electrode pad 62 into consideration and the second forbidden region 12b specified taking the bump 80 into consideration. Note that the second embodiment is not limited thereto. For example, when the end of the electrode pad 62 is close to the end of the bump 80, or when the internal stress caused by the bump is smaller than the internal stress caused by the electrode pad 62, the forbidden region may be provided substantially taking only the second forbidden region 12b into consideration.

3. Third Embodiment

Figure 5:
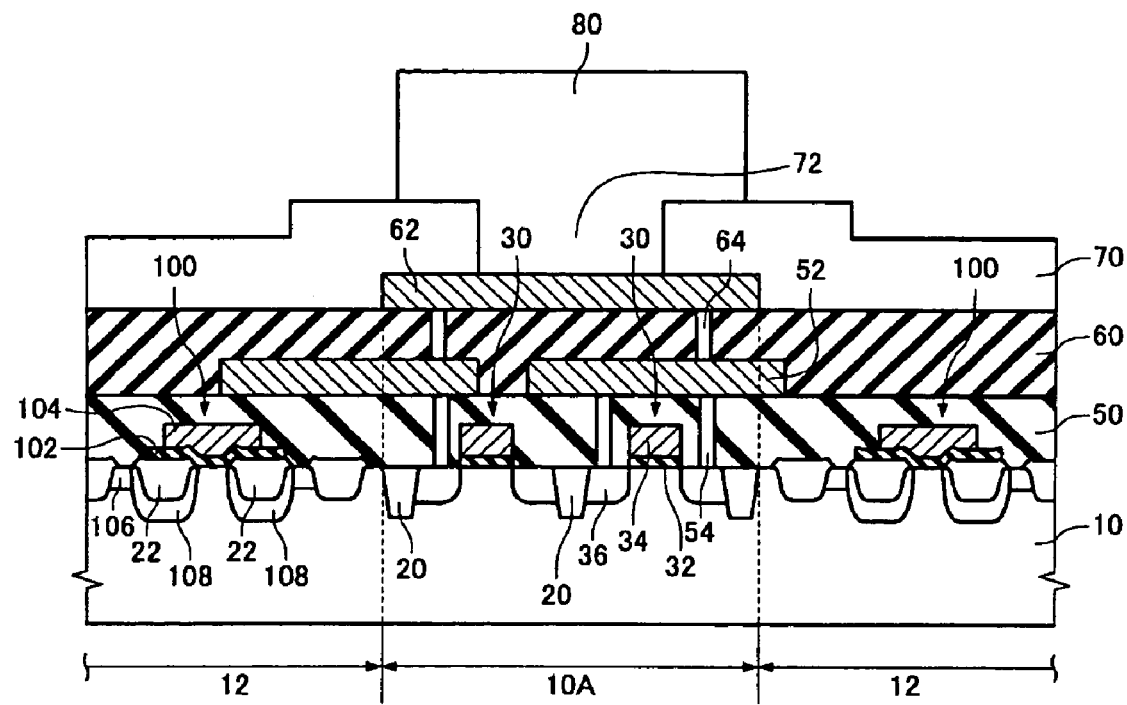
FIG. 5 is a view illustrative of a semiconductor device according to a third embodiment.

A third embodiment of the invention is described below with reference to FIG. 5. FIG. 5 is a cross-sectional view schematically showing a semiconductor device according to the third embodiment. The semiconductor device according to the third embodiment differs from the semiconductor devices according to the first and second embodiments in that a specific semiconductor element is formed in the forbidden region 12. The following description merely illustrates the difference from the semiconductor device according to the first embodiment. Note that members substantially the same as the members of the semiconductor device according to the first embodiment are assigned the same symbols. Detailed description of these members is omitted.

As shown in FIG. 5, the semiconductor device according to the third embodiment includes the active region 10A and the forbidden region 12 provided around the active region 10A. In the semiconductor device according to the third embodiment, the active region 10B (not shown) is provided outside the forbidden region 12 in the same manner as in the semiconductor device according to the first embodiment.

In the semiconductor device according to the third embodiment, a high-voltage MIS transistor is formed in the forbidden region 12. In more detail, a MIS transistor 100 having a LOCOS offset structure is formed in the forbidden region 12. The MIS transistor 100 includes an offset insulating layer 22 which is formed in the semiconductor layer 10 and reduces an electric field, a gate insulating layer 102 formed on the semiconductor layer 10, a gate electrode 104 formed on part of the offset insulating layer 22 and the gate insulating layer 102, and impurity regions 106 formed in the semiconductor layer outside the gate electrode 104 and serving as either a source region or a drain region. An offset impurity region 108 of the same conductivity type as that of the impurity region 106 and having an impurity concentration lower than that of the impurity region 106 is formed under the offset insulating layer 22.

In the MIS transistor 100, the ends of the gate electrode 104 are formed on the offset insulating layers 22. Specifically, a structure in which the end of the gate electrode 104 (first conductive layer) is disposed on the semiconductor layer 10 through a thin gate insulating layer is not formed in the forbidden region 12. A problem which may occur when the MIS transistor 30 having the structure formed in the active region 10A is formed in the forbidden region 12 is described below. The MIS transistor 30 has a structure in which the ends (side surfaces) of the gate electrode 34 are formed on the semiconductor layer 10, differing from the MIS transistor 100. Therefore, stress tends to occur in the semiconductor layer 10 at locations at which the ends of the gate electrode 34 are positioned. As described in the first and second embodiments, cracks tend to occur in the interlayer dielectrics 50 and 60 positioned over the forbidden region 12. Such cracks may reach the end (side surface) of the gate electrode 34, whereby the gate insulating layer 32 may deteriorate.

In the semiconductor device according to the third embodiment, since the ends (side surfaces) of the gate electrode 104 are disposed on the offset insulating layers 22 in the forbidden region 12, the above-described stress does not occur in the semiconductor layer 10, whereby deterioration of the gate insulating layer 102 can be prevented. This allows a semiconductor element having a specific structure to be disposed in the forbidden region 12 in addition to the active region 10A provided under the electrode pad 62 and the bump 80, whereby the semiconductor chip can be further scaled down. This increases the number of semiconductor chips formed on one wafer, whereby the manufacturing cost can be reduced.

In the third embodiment, a first conductive layer (not shown) may be disposed on the semiconductor layer 10 in the forbidden region 12 in addition to the MIS transistor 100 in the same manner as in the first and second embodiments. Note that a conductive layer in the shape of the letter "T" or "L" is not disposed as the first conductive layer in the forbidden region 12. Specific examples of the conductive layer which cannot be disposed in the forbidden region 12 are the same as those described in the first embodiment.

As examples of the conductive layer 14 which can be disposed in the forbidden region 12, an interconnect layer connected with the gate electrode 104 of the MIS transistor and the like can be given. The conductive layer may be formed in the same step as the gate electrode 34 in the active region 10A and the gate electrode 104 in the forbidden region 12. The conductive layer may at least partially include a polysilicon layer.

As described above, the semiconductor device according to the third embodiment has an advantage in that the specific MIS transistor 100 can be formed in the forbidden region 12. Moreover, the reliability of the conductive layer formed in the forbidden region 12 can be increased by not forming a conductive layer in the shape of the letter "T" or "L" as the first conductive layer in the forbidden region 12, as described in the first and second embodiments.

FIG. 5 illustrates the case where the MIS transistor 100 is formed in the forbidden region 12. Note that the third embodiment is not limited thereto. For example, part of the configuration of the MIS transistor 100 may be included in the forbidden region 12 insofar as the above-described problem, which may occur when forming a MIS transistor having a structure similar to that of the MIS transistor 30 in the active region 10A in the forbidden region 12, does not occur. In this case, a MIS transistor having a one-sided offset structure may be formed.

4. Modification

Figure 6A:
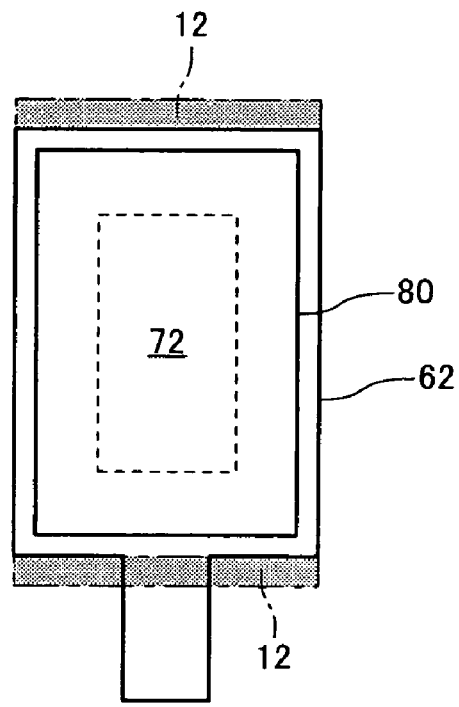
FIGS. 6A and 6B are views illustrative of a semiconductor device according to a modification of the first to third embodiments.
Figure 6B:
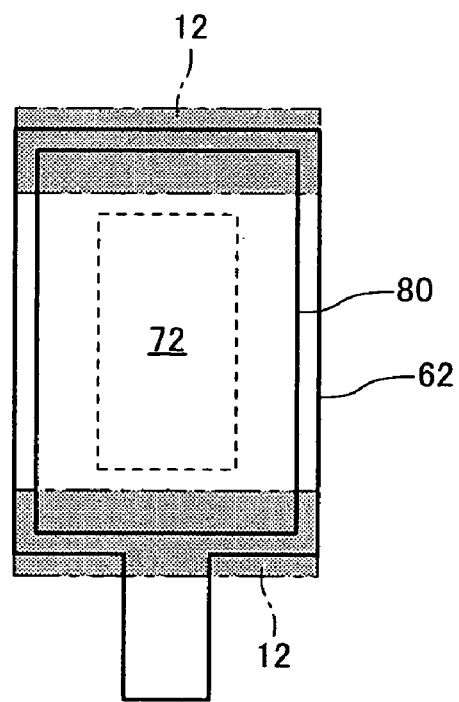

A modification of the semiconductor devices according to the first to third embodiments is described below with reference to FIGS. 6A and 6B. This modification is characterized in that the bump 80 has a rectangular shape. FIGS. 6A and 6B are plan views schematically showing the positional relationship among the bump 80, the electrode pad 62, and the forbidden region 12. The following description merely illustrates the difference from the semiconductor devices according to the first to third embodiments.

In the semiconductor device according to this modification, the bump 80 is formed in the opening 72 on the electrode pad 62, as shown in FIGS. 1 and 3. In this modification, the electrode pad 62 has a rectangular shape. The opening 72 is formed on part of the upper surface of the electrode pad 62, and the bump 80 is formed in the opening 72. The bump 80 has a planar shape smaller in area than that of the electrode pad 62. As shown in FIGS. 6A and 6B, it is preferable that the bump 80 be provided inside the electrode pad 62 when viewed from the top side.

A first modification is a modification relating to the first embodiment. In this modification, the forbidden region 12 is provided in the region positioned outward from the edge of the short side of the electrode pad 62, as shown in FIG. 6A. This configuration has the following advantage when mounting the semiconductor device by tape automated bonding (TAB) technology provided that the extension direction of a connection line 13 (lead wire) formed on a film made of a polyimide resin or the like is the direction along the long side of the electrode pad 62. In this case, the electrode pad 62 is pulled in the extension direction of the connection line, whereby stress occurs on the short side of the electrode pad 62. Therefore, cracks tend to occur in the interlayer dielectrics 50 and 60 on the edge on the short side of the bump 80. This modification reliably prevents the semiconductor element from being formed at a position in which the reliability is decreased by providing the forbidden region 12 on the short side of the electrode pad 62.

A second modification is a modification relating to the second embodiment. In this modification, the forbidden region 12 includes a first forbidden region specified taking the electrode pad 62 into consideration and a second forbidden region specified taking the bump 80 into consideration, as shown in FIG. 6B. Specifically, the forbidden region 12 is provided in the region (first forbidden region) positioned outward from the edge of the short side of the electrode pad 62 and the region (second forbidden region) positioned inward and outward from the edge of the short side of the bump 80.

Figure 7:
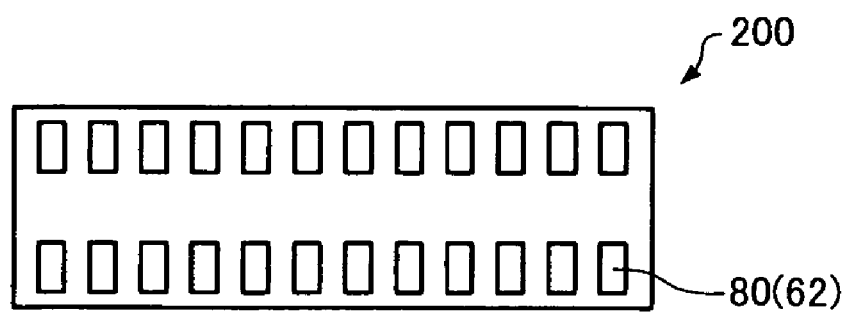
FIG. 7 is a view illustrative of a semiconductor device according to a modification.

In particular, in a semiconductor chip 200 which is scaled down as shown in FIG. 7, a structure may be required in which the opening 72 and the bump 80 are formed in a rectangular planar shape to provide a number of openings 72. According to this modification, a semiconductor device which is scaled down and provided with improved reliability can be provided by providing the forbidden region 12 in an appropriate region of the semiconductor device having such rectangular electrode pads 62 (bumps 80).

The above embodiments illustrate the case where two interlayer dielectrics 50 and 60 are provided and one interconnect layer 52 is provided between the interlayer dielectrics 50 and 60. Note that the above embodiments are not limited thereto. A structure may also be employed in which three or more interlayer dielectrics are stacked and interconnect layers in a number corresponding to the number of interlayer dielectrics are provided.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A semiconductor device, comprising:
   an electrode pad;
   a passivation layer overlapping with a first part of the electrode pad and having an opening which overlaps with a second part of the electrode pad, a first surface of the passivation layer facing a semiconductor layer, and a second surface of the passivation layer being opposite to the first surface of the passivation layer, the passivation layer having a level difference, the level difference being on the second surface of the passivation layer and corresponding to a shape of the electrode pad;
   the semiconductor layer having a first region and a second region, the first region being defined in a first range inward from a first line extending vertically downward from an edge of the electrode pad, and the second region having a width corresponding to a thickness of the passivation layer outward from the first line;
   a first inter layer dielectric positioned between the electrode pad and the semiconductor layer, a first surface of the first inter layer dielectric facing to the semiconductor layer, and a second surface of the first inter layer dielectric being opposite to the first surface of the first inter layer dielectric;
   a conductive layer positioned on the second surface of the first inter layer dielectric, the conductive layer having a first portion and a second portion, the second portion being connected with the first portion at a connection section, the connection section being positioned entirely outside of the second region, the first portion having a first width, and the second portion having a second width that is smaller than the first width; and
   a second inter layer dielectric positioned between the electrode pad and the conductive layer,
   the electrode pad being formed on a first surface of the second inter layer dielectric,
   the electrode pad having a rectangular shape when viewed from a direction perpendicular to the first surface of the second inter layer dielectric,
   the rectangular shape of the electrode pad having a short side and a long side, and
   the second region of the semiconductor layer being defined outward from a third line extending vertically downward from the short side of the electrode pad.

2. The semiconductor device as defined in claim 1, the second region surrounding an element.

3. The semiconductor device as defined in claim 1, the second region being 1.0 to 2.5 micrometers outward from the first line.

4. The semiconductor device as defined in claim 1, further comprising:
   a bump formed in the opening.

5. The semiconductor device as defined in claim 1, further comprising:
   a transistor formed in the first region.

6. The semiconductor device as defined in claim 1, the first portion of the conductive layer and the second portion of the conductive layer forming a shape of the letter "T" at the connection section.

7. The semiconductor device as defined in claim 1, the conductive layer being a polysilicon layer.

8. The semiconductor device as defined in claim 1, the first portion of the conductive layer and the second portion of the conductive layer forming a shape of the letter "L" at the connection section.

9. A semiconductor device, comprising:
   an electrode pad;
   a passivation layer overlapping with a first part of the electrode pad and having an opening which overlaps with a second part of the electrode pad, a first surface of the passivation layer facing a semiconductor layer, and a second surface of the passivation layer being opposite to the first surface of the passivation layer, the passivation layer having a level difference, the level difference being on the second surface of the passivation layer and corresponding to a shape of the electrode pad;

the semiconductor layer having a first region and a second region, the first region defined in a first range inward from a first line extending vertically downward from an edge of the electrode pad, the second region having a width corresponding to a thickness of the passivation layer outward from the first line;

a first inter layer dielectric positioned between the electrode pad and the semiconductor layer, a first surface of the inter layer dielectric facing the semiconductor layer, and a second surface of the inter layer dielectric being opposite to the first surface of the inter layer dielectric;

a conductive layer positioned on the second surface of the first inter layer dielectric, the conductive layer having a first portion and a second portion, the second portion being connected with the first portion at a connection section, the connection section being positioned entirely outside of the second region, the first portion having a first width, the second portion having a second width that is smaller than the first width; and a second inter layer dielectric positioned between the electrode pad and the first conductive layer, the electrode pad being formed on the second inter layer dielectric, the electrode pad having a surface in contact with the second inter layer dielectric, the surface having a rectangular shape, the rectangular shape of the electrode pad having a short side and a long side, and the second region of the semiconductor layer being defined outward from a third line extending vertically downward from the short side of the electrode pad.

* * * * *